United States Patent
Kim et al.

(10) Patent No.: US 7,416,968 B2
(45) Date of Patent: Aug. 26, 2008

(54) METHODS OF FORMING FIELD EFFECT TRANSISTORS HAVING METAL SILICIDE GATE ELECTRODES

(75) Inventors: Hyun-Su Kim, Gyeonggi-do (KR);
Jong-Ho Yun, Gyeonggi-do (KR);
Byung-Hak Lee, Gyeonggi-do (KR);
Eun-Ji Jung, Gyeonggi-do (KR);
Gil-Heyun Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 317 days.

(21) Appl. No.: 11/230,586

(22) Filed: Sep. 20, 2005

(65) Prior Publication Data

US 2006/0091436 A1    May 4, 2006

(30) Foreign Application Priority Data

Sep. 21, 2004    (KR) .................. 10-2004-0075658

(51) Int. Cl.
*H01L 21/336*    (2006.01)
*H01L 21/3205*    (2006.01)
(52) U.S. Cl. .................. 438/592; 438/299; 438/301; 438/303
(58) Field of Classification Search .................. 438/592, 438/299, 301, 303
See application file for complete search history.

(56) References Cited

U.S. PATENT DOCUMENTS 6,060,387 A * 5/2000 Shepela et al. .............. 438/630
6,204,103 B1 3/2001 Bai et al.
2004/0038435 A1 2/2004 Wieczorek et al.
2004/0043595 A1* 3/2004 Lee et al. .................. 438/592

FOREIGN PATENT DOCUMENTS

KR    1020040008407 A    1/2004

* cited by examiner

*Primary Examiner*—Thanh Nguyen
(74) *Attorney, Agent, or Firm*—Myers Bigel Sibley & Sajovec

(57) ABSTRACT

Methods of forming field effect transistors according to embodiments of the invention include forming a conductive gate electrode (e.g., polysilicon gate electrode) on a semiconductor substrate and forming a first metal layer on the conductive gate electrode. This first metal layer may include a material selected from a group consisting of nickel, cobalt, titanium, tantalum and tungsten. The first metal layer and the conductive gate electrode are thermally treated for a sufficient duration to convert a first portion of the conductive gate electrode into a first metal silicide region. The first metal layer and the first metal silicide region are then removed to expose a second portion of the conductive gate electrode. A second metal layer is then formed on the second portion of the conductive gate electrode. This second metal layer may include a material selected from a group consisting of nickel, cobalt, titanium, tantalum and tungsten. The second metal layer and the second portion of the conductive gate electrode are thermally treated for a sufficient duration to thereby convert the second portion of the conductive gate electrode into a second metal silicide region.

31 Claims, 10 Drawing Sheets

METHODS OF FORMING FIELD EFFECT
TRANSISTORS HAVING METAL SILICIDE
GATE ELECTRODES

REFERENCE TO PRIORITY APPLICATION

This patent application claims priority from Korean Patent Application No. 2004-0075658, filed Sep. 21, 2004, the disclosure of which is hereby incorporated herein by reference.

FIELD OF THE INVENTION

The present invention relates to methods of forming integrated circuit devices and, more particularly, to methods of forming field effect transistors having silicided gate electrodes.

BACKGROUND OF THE INVENTION

A semiconductor device may include discrete devices such as a capacitor, a transistor, etc. The transistor may include a gate pattern on a semiconductor substrate and impurity regions disposed in the semiconductor substrate, which overlap the gate pattern. The impurity regions and the gate pattern determine the electrical characteristics of the transistor when the semiconductor device is driven. The impurity regions are referred to as source and drain regions of the transistor. The gate pattern is formed using at least one conductive layer. The conductive layer may be formed using a doped polysilicon layer.

The conductive layer may cause a parasitic capacitor to be formed in the semiconductor substrate while the transistor is driven. The parasitic capacitor is formed by diffusion of impurity ions into the conductive layer. A capacitance of the parasitic capacitor makes it difficult to transfer a voltage applied to the gate pattern to the semiconductor substrate within a desired time. In particular, the parasitic capacitor may cause a voltage drop corresponding to the capacitance to deteriorate the drivability of the transistor. Therefore, it is typically necessary for the gate pattern to suppress diffusion of the impurity ions in the conductive layer while the transistor is driven.

U.S. Pat. No. 6,204,103 to Lars W. Liebmann, Gang Bai, et al (the '103 patent) discloses a process to make complementary silicide metal gates for CMOS technology. According to the '103 patent, the process includes forming an insulating layer between first and second MOSFETs (metal oxide semiconductor field effect transistors). A first metal layer is formed on a gate of the first MOSFET. Then, a second metal layer is formed on a gate of the second MOSFET. The first metal layer reacts with polysilicon composing the gate of the first MOSFET to form a first silicide region. The second metal layer reacts with polysilicon composing the gate of the second MOSFET to form a second silicide region. However, it is difficult for the process to stably form the first and second silicide regions on the entire surface of the semiconductor substrate, since the first and second metal layers may insufficiently react with the polysilicon composing the gates of the first and second MOSFETs.

SUMMARY OF THE INVENTION

Methods of forming field effect transistors according to embodiments of the invention include forming a conductive gate electrode (e.g., polysilicon gate electrode) on a semiconductor substrate and forming a first metal layer on the conductive gate electrode. This first metal layer may include a material selected from a group consisting of nickel, cobalt, titanium, tantalum and tungsten. The first metal layer and the conductive gate electrode are thermally treated for a sufficient duration to convert a first portion of the conductive gate electrode into a first metal silicide region. The first metal layer and the first metal silicide region are then removed to expose a second portion of the conductive gate electrode. A second metal layer is then formed on the second portion of the conductive gate electrode. This second metal layer may include a material selected from a group consisting of nickel, cobalt, titanium, tantalum and tungsten. The second metal layer and the second portion of the conductive gate electrode are thermally treated for a sufficient duration to thereby convert the second portion of the conductive gate electrode into a second metal silicide region.

According to additional aspects of these embodiments, the step of forming the first metal layer is preceded by the steps of implanting source and drain region dopants into the semiconductor substrate, using the conductive gate electrode as a first implant mask, and then forming sidewall spacers on the conductive gate electrode. Additional source and drain region dopants are then implanted into the semiconductor substrate, using the conductive gate electrode and sidewall spacers as a second implant mask. In addition, the step of forming the first metal layer is preceded by the steps of depositing an insulating layer on the conductive gate electrode and on the sidewall spacers and planarizing the insulating layer for a sufficient duration to expose the conductive gate electrode.

Additional embodiments of the invention include methods of forming an integrated circuit by forming first and second polysilicon gate electrodes on a semiconductor substrate and forming sidewall spacers on the first and second gate electrodes. An insulating layer is formed on and between the first and second gate electrodes. The insulating layer is planarized for a sufficient duration to expose upper surfaces of the first and second gate electrodes. A first metal layer is formed on the exposed upper surfaces of the first and second gate electrodes. The first metal layer and the first and second gate electrodes are thermally treated for a sufficient duration to thereby convert first portions of the first and second gate electrodes into first metal silicide regions. The first metal layer and the first metal silicide regions are then removed to expose second portions of the first and second gate electrodes. A second metal layer is formed on the second portions of the first and second gate electrodes. The second metal layer and the second portions of the first and second gate electrodes are then thermally treated to thereby convert second portions of the first and second gate electrodes into second metal silicide regions. These methods further include the step of planarizing the second metal layer for a sufficient duration to expose the planarized insulating layer. This insulating layer is then selectively etched to define a contact hole therein that exposes the semiconductor substrate.

DETAILED DESCRIPTION OF THE INVENTION

Figure 1:
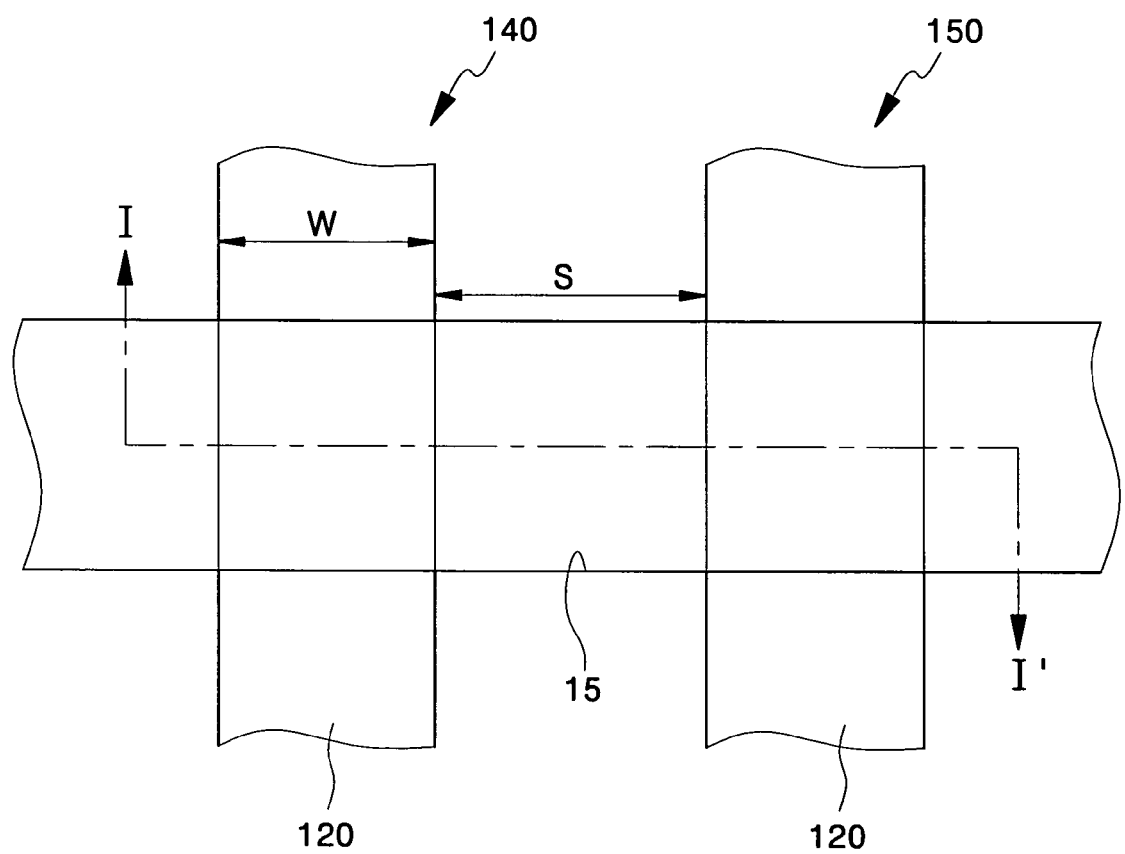
FIG. 1 is a layout view illustrating metal gate patterns according to an embodiment of the invention.

The present invention now will be described more fully hereinafter with reference to the accompanying drawings, in which preferred embodiments of the invention are shown.

This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 2:
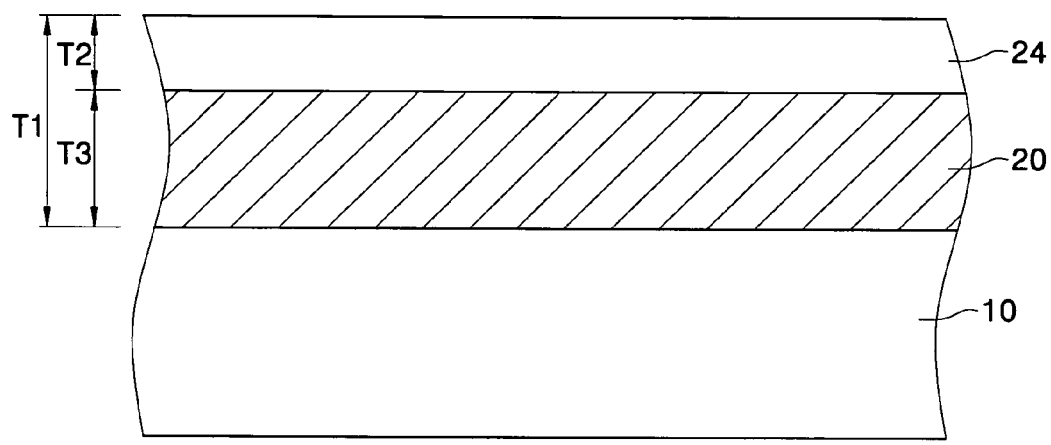
FIGS. 2 to 18 cross-sectional views illustrating methods of forming metal gate patterns taken along line I-I' of FIG. 1 according to embodiments of the invention.
Figure 3:
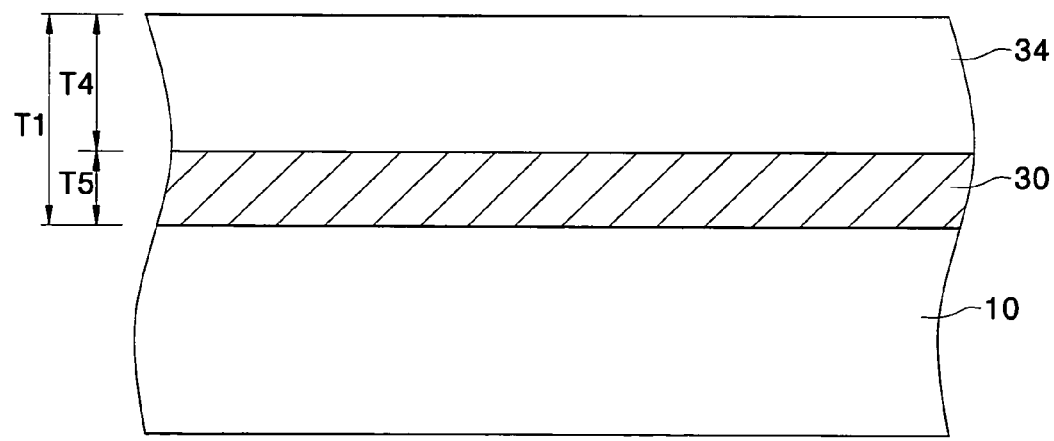

Referring to FIGS. 1 to 3, a conductive layer 20 and an alignment capping layer 24 are sequentially formed on a semiconductor substrate 10 of an active region 15 to a predetermined thickness T1. Preferably, the alignment capping layer 24 is formed of an insulating layer having an etching ratio different from that of the conductive layer 20. The alignment capping layer 24 may be formed of a silicon nitride ($Si_3N_4$) layer. The alignment capping layer 24 is formed to a predetermined thickness T2. Preferably, the conductive layer 20 is formed of an N+ type polysilicon layer to have a predetermined thickness T3. Preferably, the semiconductor substrate 10 is formed to have a P-type conductivity.

In accordance with another embodiment of the invention, as shown in FIG. 3, a conductive layer 30 and a sacrificial layer 34 are sequentially formed on a semiconductor substrate 10 of an active region 15 to a predetermined thickness T1. Preferably, the sacrificial layer 34 is formed of an insulating layer having an etching ratio different from that of the conductive layer 30. The sacrificial layer 34 may be formed of a silicon oxide ($SiO_2$) layer to have a predetermined thickness T4. Preferably, the conductive layer 30 is formed of an N+ type polysilicon layer to have a predetermined thickness T5. Preferably, the conductive layer 30 has a thickness less than that of the conductive layer 20 of FIG. 2 and the sacrificial layer 34 has a thickness greater than that of the alignment capping layer 24 of FIG. 2.

Figure 4:
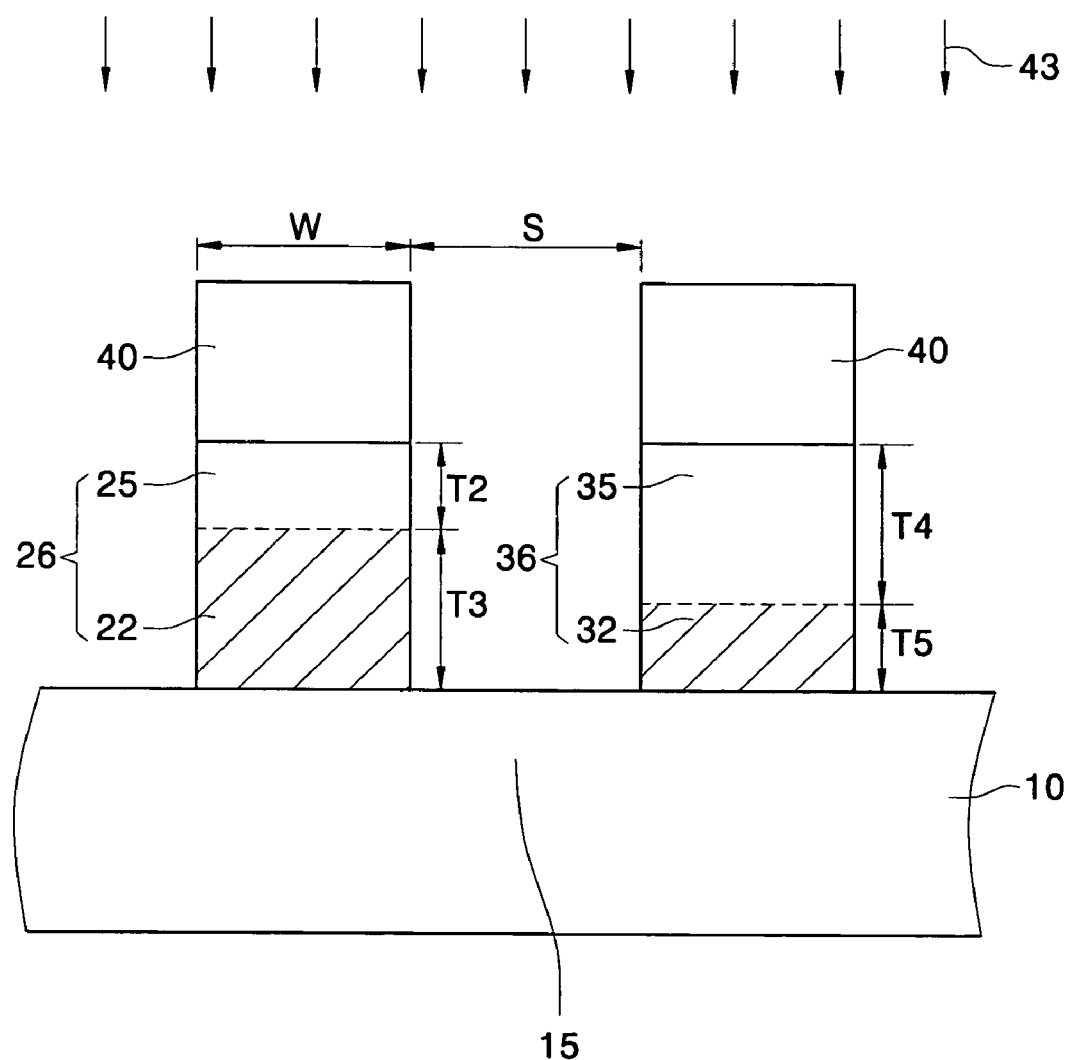
Figure 5:
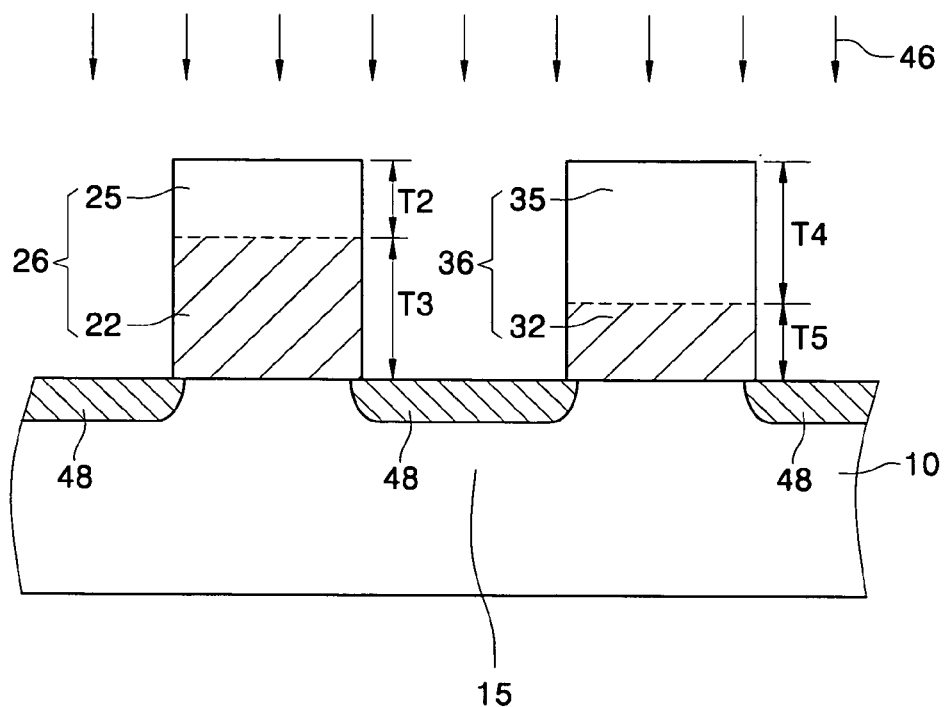

Referring to FIGS. 1, 4 and 5, photoresist patterns 40 are formed on the alignment capping layer 24. The photoresist patterns 40 are formed in a line shape to run across the active region 15. The photoresist patterns 40 also have a pitch having a predetermined width W and a predetermined space S. An etching process 43 is sequentially performed on the alignment capping layer 24 and the conductive layer 20 using the photoresist patterns 40 as an etching mask. The etching process 43 is performed to expose the semiconductor substrate 10, thereby forming alignment patterns 26 between the semiconductor substrate 10 of the active region 15 and the photoresist patterns 40. Each of the alignment patterns 26 includes a conductive layer pattern 22 and an alignment capping layer pattern 25, which are sequentially stacked.

As shown in FIG. 5, an ion implantation process 46 is performed on the semiconductor substrate 10 using the alignment patterns 26 as a mask. The ion implantation process 46 forms first impurity regions 48 in the semiconductor substrate 10 to overlap the alignment patterns 26. Preferably, the first impurity regions 48 are formed to have a conductivity different from that of the semiconductor substrate 10. The first impurity regions 48 may be formed of impurity ions using one selected from phosphorus (P) and arsenic (As).

In accordance with another embodiment of the invention, photoresist patterns 40 may be formed on the sacrificial layer 34 of FIG. 3. The photoresist patterns 40 preferably are formed in a line shape to run across the active region 15. The photoresist patterns 40 also have a pitch having a predetermined width W and a predetermined space S as shown in FIG. 4. An etching process 43 is sequentially performed on the sacrificial layer 34 and the conductive layer 30 using the photoresist patterns 40 as an etching mask. The etching process 43 is performed to expose the semiconductor substrate 10, thereby forming alignment patterns 36 between the semiconductor substrate 10 of the active region 15 and the photoresist patterns 40 as shown in FIG. 5. Each of the alignment patterns 36 includes a conductive layer pattern 32 and a sacrificial layer pattern 35, which are sequentially stacked.

An ion implantation process 46 is performed in the semiconductor substrate 10 using the alignment patterns 36 as a mask. The ion implantation process 46 forms first impurity regions 48 in the semiconductor substrate 10 to overlap the alignment patterns 36. Preferably, the first impurity regions 48 are formed to have a conductivity different from that of the semiconductor substrate 10. The first impurity regions 48 may be formed of impurity ions using one of phosphorus (P) and arsenic (As).

Figure 6:
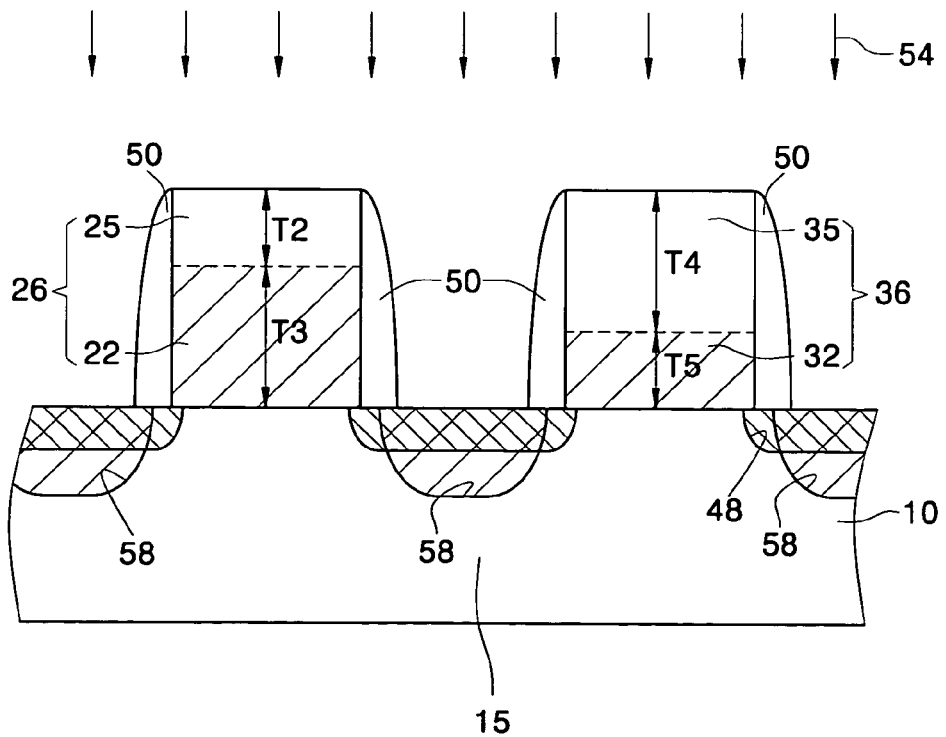
Figure 7:
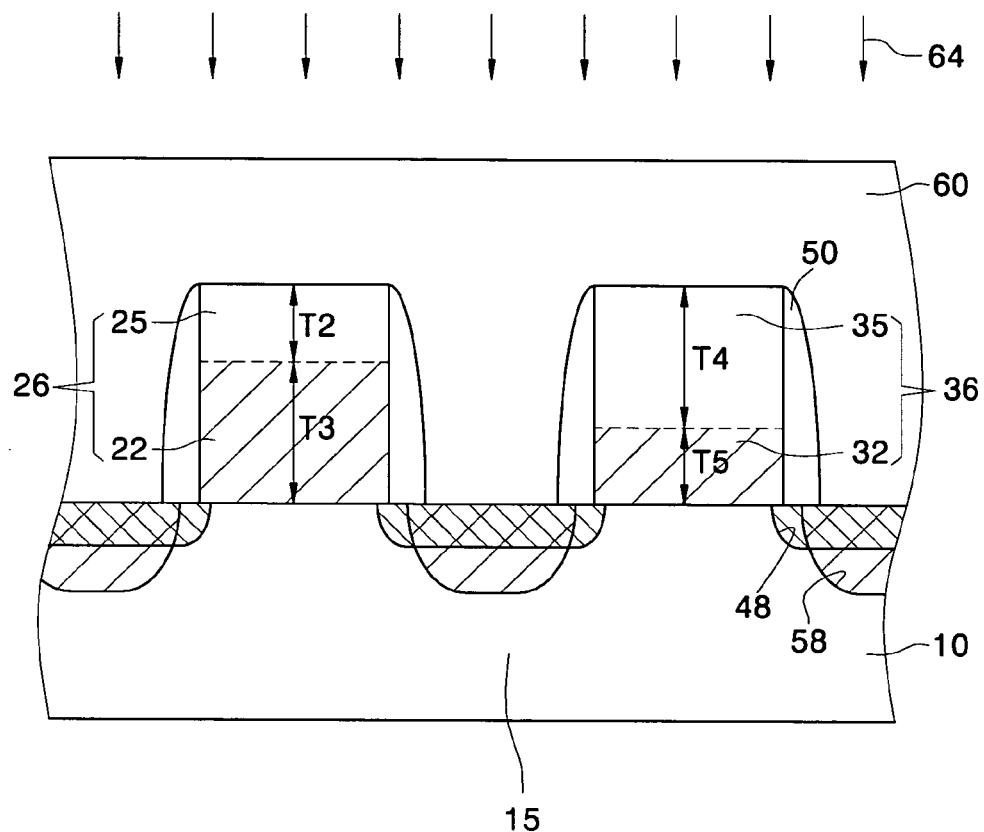

Referring to FIGS. 1, 6 and 7, spacers 50 are formed to cover sidewalls of the alignment patterns 26. Preferably, the spacers 50 are formed of an insulating layer having an etching ratio equal to that of the alignment capping layer pattern 25. An ion implantation process 54 is performed in the semiconductor substrate 10 using the spacers 50 and the alignment patterns 26 as a mask. The ion implantation process 54 forms second impurity regions 58 in the semiconductor substrate 10 to overlap the spacers 50. Preferably, the second impurity regions 58 are formed to have a conductivity equal to that of the first impurity regions 48.

Then, a buried interlayer insulating layer 60 is formed on the semiconductor substrate 10 to cover the spacers 50 and the alignment patterns 26 as shown in FIG. 7. Preferably, the buried interlayer insulating layer 60 is formed of an insulating layer having an etching ratio different from that of the spacers 50. The buried interlayer insulating layer 60 may be formed of a silicon oxide layer including phosphorus (P) and boron (B). The buried interlayer insulating layer 60, the spacers 50 and the alignment patterns 26 are planarized through a planarization process 64, which is preferably performed by using a chemical mechanical polishing technique or an etching back technique.

In accordance with another embodiment of the invention, spacers 50 are formed to cover sidewalls of the alignment patterns 36 of FIG. 5. Preferably, the spacers 50 are formed of an insulating layer having an etching ratio different from that of the sacrificial layer pattern 35. An ion implantation process 54 is performed in the semiconductor substrate 10 using the spacers 50 and the alignment patterns 36 as a mask. The ion implantation process 54 forms second impurity regions 58 in the semiconductor substrate 10 to overlap the spacers 50. Preferably, the second impurity regions 58 are formed to have a conductivity equal to that of the first impurity regions 48.

Next, a buried interlayer insulating layer 60 is formed on the semiconductor substrate 10 to cover the spacers 50 and the alignment patterns 36. Preferably, the buried interlayer insulating layer 60 is formed of an insulating layer having an etching ratio different from that of the spacers 50 and the sacrificial layer pattern 35. The buried interlayer insulating layer 60 may be formed of a silicon oxide layer including phosphorus (P) and boron (B). The buried interlayer insulating layer 60, the spacers 50 and the alignment patterns 36 are planarized through a planarization process 64, which is preferably performed by using a chemical mechanical polishing technique or an etching back technique.

Figure 8:
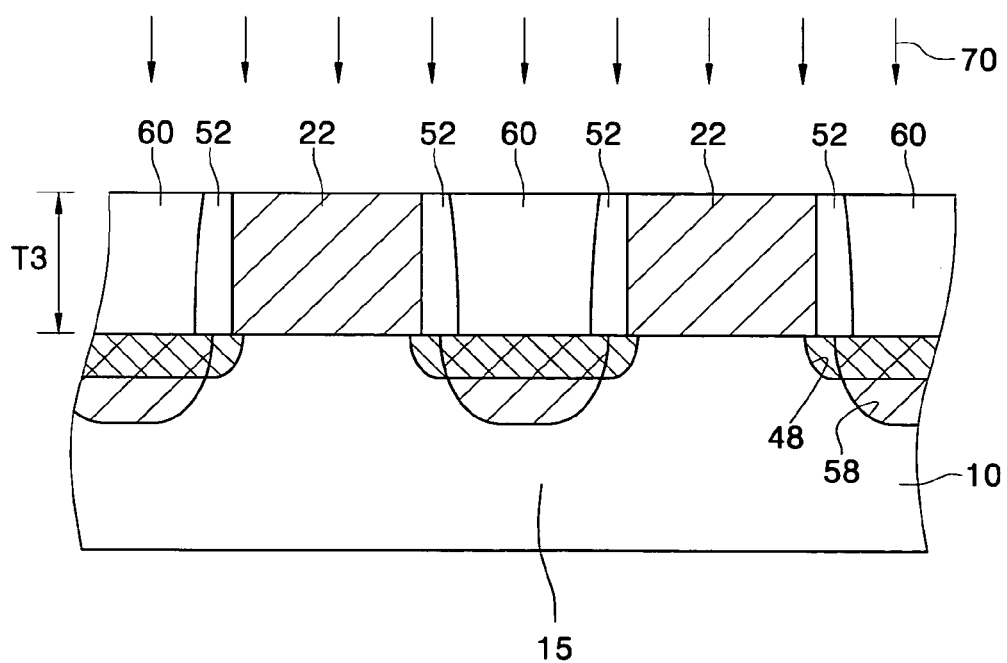

After FIG. 7, an embodiment of the invention will be first described with reference with FIGS. 8 to 10, another embodiment of the invention will be described with reference with FIGS. 11 and 12, and the embodiments of the invention will be simultaneously described with reference with FIG. 13.

Referring to FIGS. 1, 8 to 13, the alignment capping layer pattern 25 is removed from the semiconductor substrate 10 to expose the conductive layer patterns 22 through the planarization process 64, thereby forming spacer patterns 52 interposed between the buried interlayer insulating layer 60 and the conductive layer patterns 22. At this time, the conductive layer patterns 22 preferably is formed to have the thickness T3.

A deposition process 70 is performed on the spacer patterns 52, the conductive patterns 22 and the buried interlayer insulating layer 60. Preferably, the deposition process 70 may be performed by using one selected from PVD (physical vapor deposition), CVD (chemical vapor deposition), and ALD (atomic layer deposition). The deposition process 70 forms a disposable metal layer 72 to cover the spacer patterns 52, the conductive layer patterns 22 and the buried interlayer insulating layer 60. Preferably, the disposable metal layer 72 is formed of one selected from a group consisting of nickel (Ni), cobalt (Co), titanium (Ti), tantalum (Ta) and tungsten (W).

Figure 9:
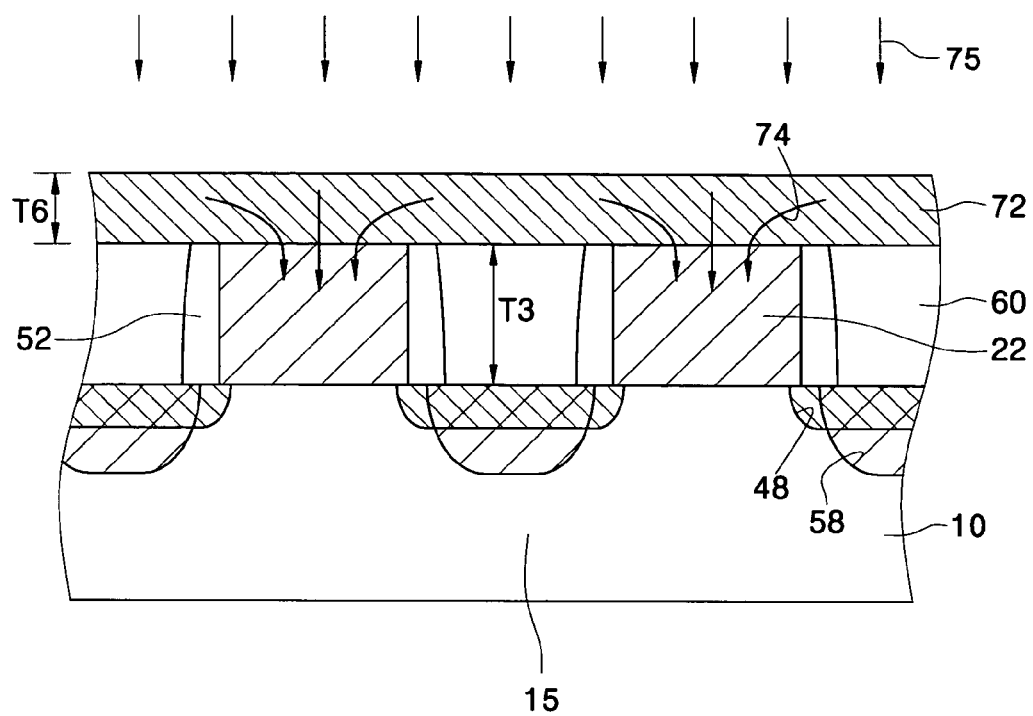
Figure 10:
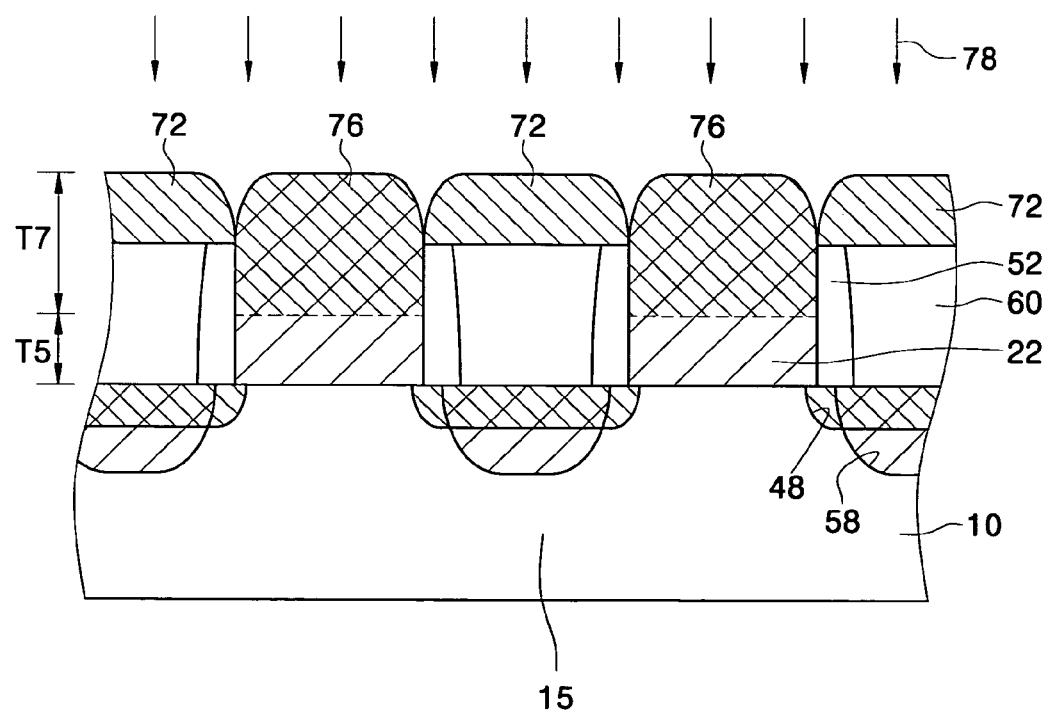

A thermal treatment process 75 is performed on the semiconductor substrate 10 having the disposable metal layer 72 as shown in FIG. 9. Preferably, the thermal treatment process 75 is performed using RTP (rapid thermal process) or furnace anneal to react portions of the conductive layer patterns 22 with the disposable metal layer 72 so that metal atoms 74 of the disposable metal layer 72 diffuse into the conductive layer patterns 22. The thermal treatment process 75 may be performed at a temperature of about 150 to 800° C. for a predetermined time in consideration of diffusion of the impurity ions of the first and second impurity regions 48 and 58. As such, the thermal treatment process 75 forms respectively disposable metal silicide layers 76 on the portions of the conductive layer patterns 22 using the spacer patterns 52 and the buried interlayer insulating layer 60 as masks. At this time, preferably, the remaining portions of the conductive layer patterns 22 are left to have a predetermined thickness equal to the thickness T5 of the conductive layer pattern 32 of the alignment pattern 36 of FIG. 5. Preferably, the portions and the remaining portions of the conductive layer patterns 22 are formed to have different thicknesses between the spacer patterns 52, respectively. Alternatively, the portions and the remaining portions of the conductive layer patterns 22 may be formed between the spacer patterns 52 to have the same thickness.

Figure 13:
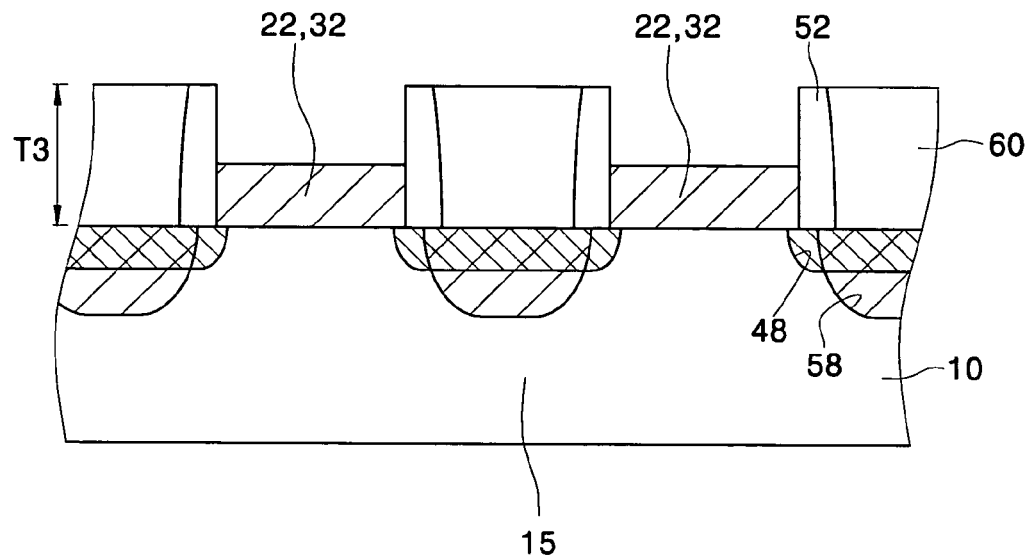
Figure 14:
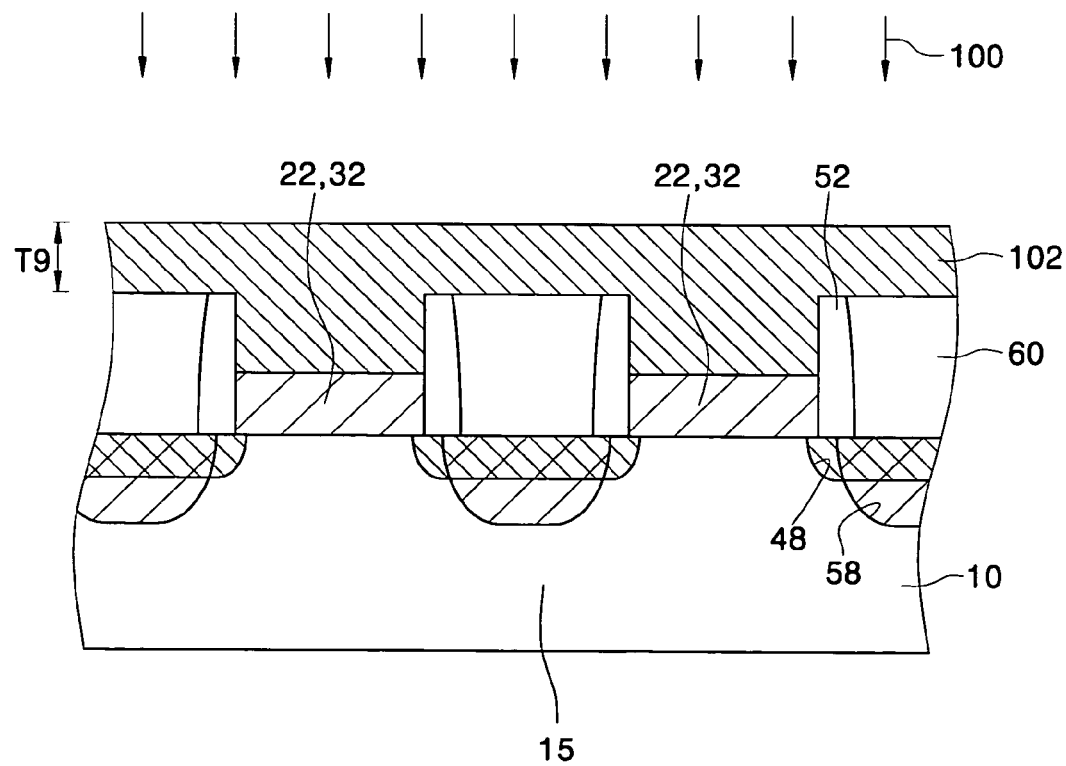

Next, an etching process 78 is performed on the disposable metal layer 72 and the disposable metal silicide layer 76 to remove the disposable metal layer 72 and the disposable metal silicide layer 76 from the semiconductor substrate 10 to thereby expose the other portions of the conductive layer patterns 22 as shown in FIG. 13. Preferably, the etching process 78 is performed to have an etching ratio relatively with respect to the disposable metal layer 72 and the disposable metal silicide layer 76 as compared with the conductive layer patterns 22, the spacer patterns 52 and the buried interlayer insulating layer 60. Preferably, the etching process 78 is performed by using a wet etching technique.

Figure 11:
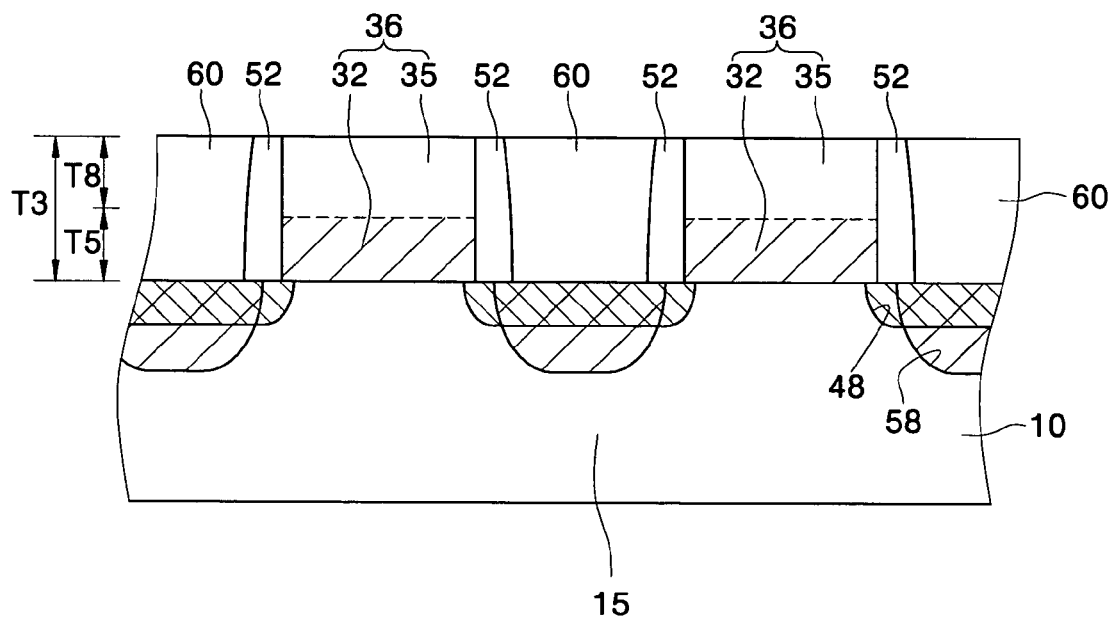

In accordance with another embodiment of the invention, the planarization process 64 of FIG. 7 may be sequentially performed on the buried interlayer insulating layer 60 and the sacrificial layer patterns 35 as shown in FIG. 11. Preferably, the sacrificial layer patterns 35 are formed to have a predetermined thickness T8 smaller than the thickness T4 of the sacrificial layer patterns 35 of the alignment pattern 36 of FIG. 5 in consideration of the following semiconductor manufacturing processes. As a result, the spacer patterns 52 are formed between the buried interlayer insulating layer 60 and the alignment pattern 36 through the planarization process 64.

Figure 12:
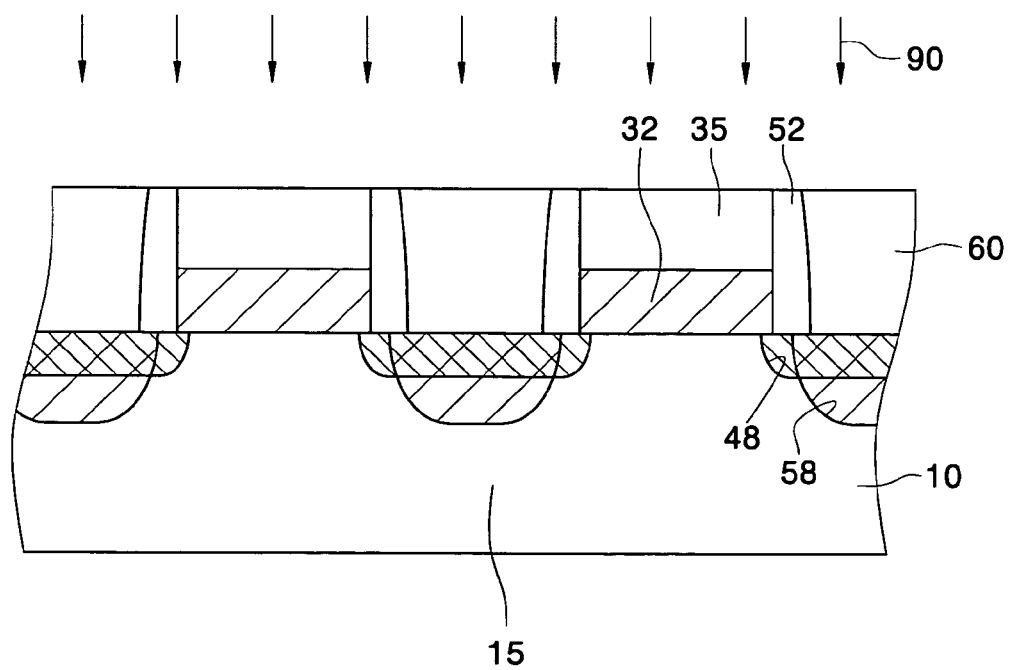

An etching process 90 is performed on the sacrificial layer patterns 35 using the spacer patterns 52 and the buried interlayer insulating layer 60 as an etching mask to remove the sacrificial layer patterns 35 from the semiconductor substrate 10 as shown in FIG. 12. At this time, the etching process 90 exposes the conductive layer patterns 32 as shown in FIG. 13. Preferably, the etching process 90 is performed to have an etching ratio relatively with respect to the sacrificial layer patterns 35 as compared with the conductive layer patterns 32, the spacer patterns 52 and the buried interlayer insulating layer 60. Preferably, the etching process 78 is performed by using a wet or dry etching technique. Preferably, the conductive layer patterns 32 and the sacrificial layer patterns 35 are formed to have a different thickness between the spacer patterns 52, but the conductive layer patterns 32 and the sacrificial layer patterns 35 may be formed to have the same thickness between the spacer patterns 52.

Hereinafter, embodiments of the invention will be described in reference with FIGS. 14 to 18. Referring to FIGS. 1, 14 to 16, a deposition process 100 is performed on the conductive layer patterns 22 or 32, the spacer patterns 52 and the buried interlayer insulating layer 60. Preferably, the deposition process 100 may be performed by using one selected from PVD (physical vapor deposition), CVD (chemical vapor deposition), and ALD (atomic layer deposition). The deposition process 100 forms pattern metal layer 102 to a predetermined thickness T9 to cover the conductive layer patterns 22 or 32, the spacer patterns 52 and the buried interlayer insulating layer 60, so that the pattern metal layer 102 sufficiently fills spaces between the spacer patterns 52. Preferably, the pattern metal layer 102 is formed of one selected from a group consisting of Ni, Co, Ti, Ta and W.

Figure 15:
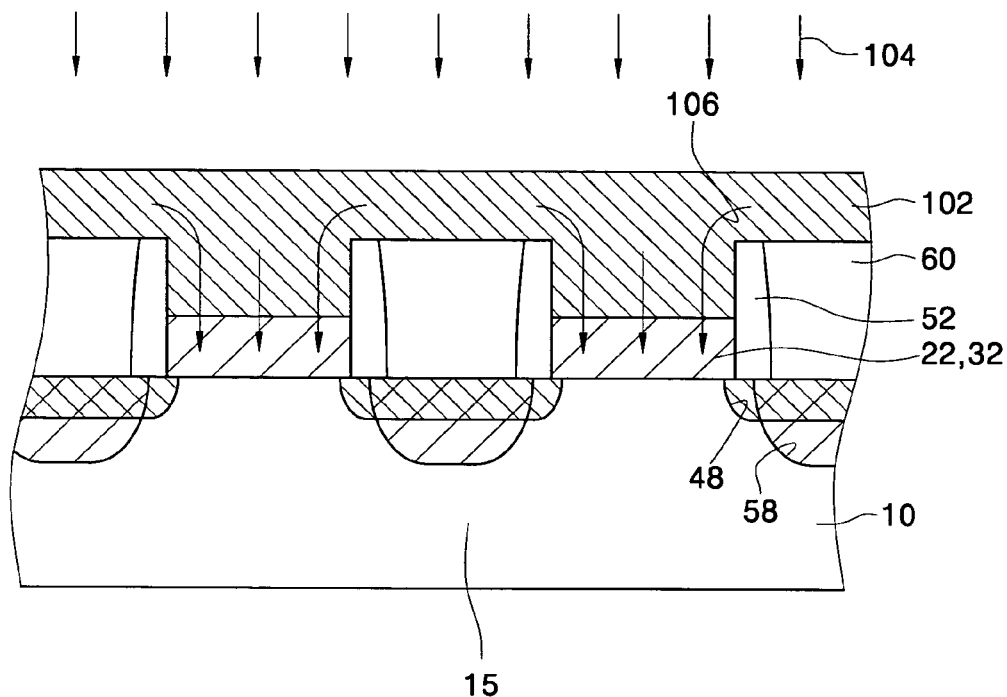
Figure 16:
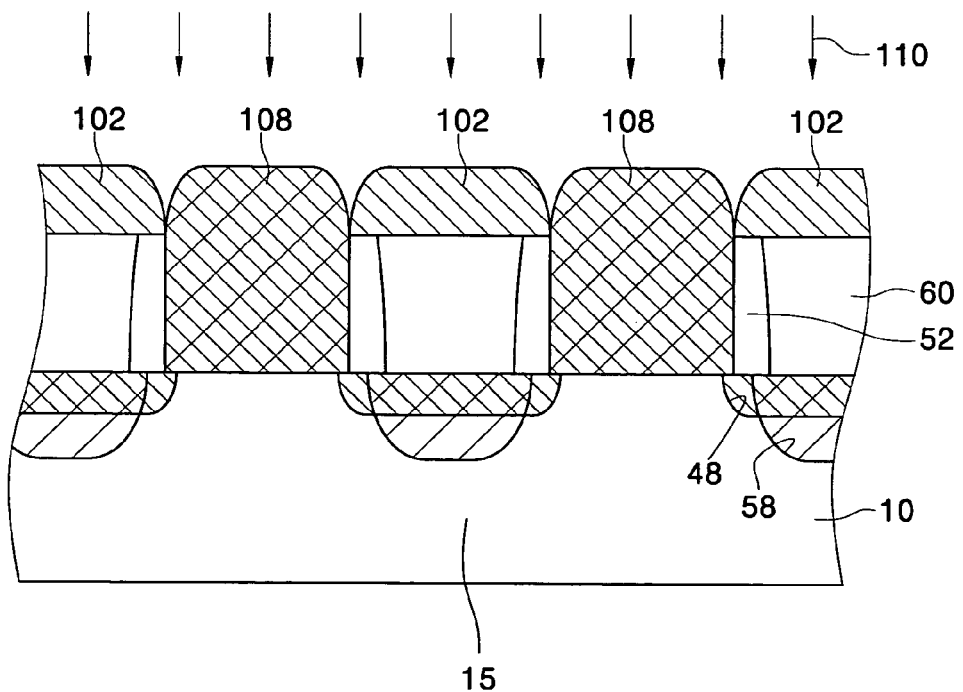

A thermal treatment process 104 is performed on the semiconductor substrate 10 having the pattern metal layer 102 as shown in FIG. 15. Preferably, the thermal treatment process 104 is performed using RTP (rapid thermal process) or furnace anneal so that metal atoms 106 of the pattern metal layer 102 diffuse into the conductive layer patterns 22 or 32. The thermal treatment process 104 may be performed at a temperature of 200 to 1000° C. for a predetermined time in consideration of diffusion of the impurity ions of the first and second impurity regions 48 and 58 to sufficiently react the pattern metal layer 102 with the conductive layer patterns 22 or 32. As such, a metal silicide layer 108 confined to the conductive layer pattern 22 or 32 is formed using the spacer patterns 52 and the buried interlayer insulating layer 60 as a mask. The confined metal silicide layer 108 is formed between the spacer patterns 52. An etching process 110 is performed on the confined metal silicide layer 108 as shown in FIG. 16. Preferably, the etching process 110 is performed using the buried interlayer insulating layer 60 and the spacer patterns 52 as an etching buffer layer.

Figure 17:
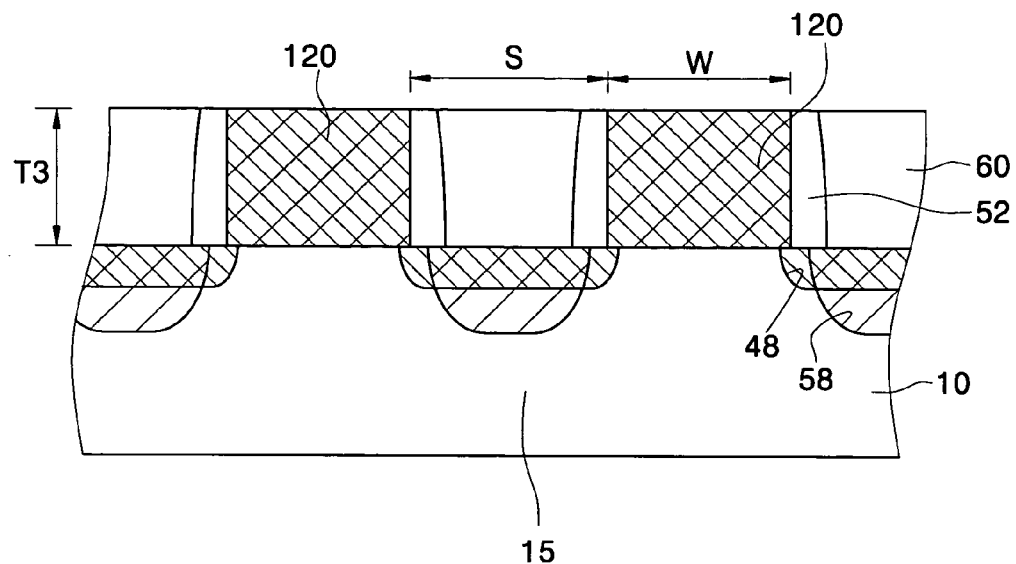
Figure 18:
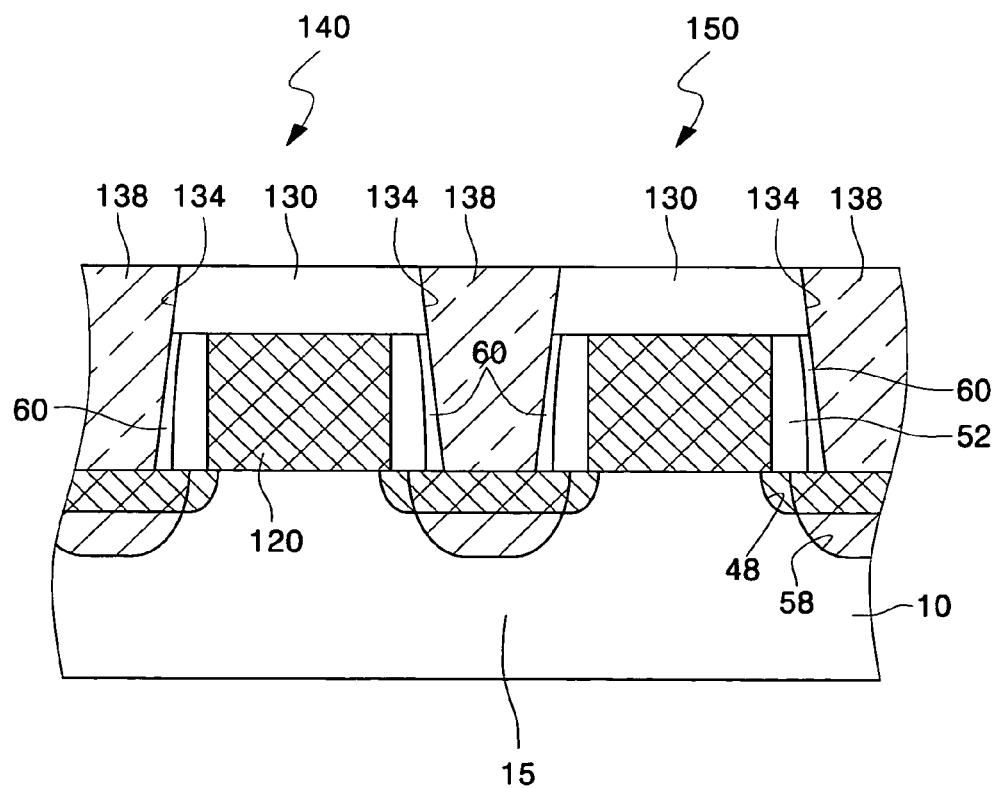

Referring to FIGS. 1, 17 and 18, metal gate patterns 120 are formed between the spacer patterns 52 through the etching process 110. Preferably, upper surfaces of the metal gate patterns 120 are formed on the same plane as the upper surfaces of the spacer patterns 52, but may be formed on a plane different from the upper surfaces of the spacer patterns 52. Preferably, each metal gate pattern 120 is formed to a thickness equal to that of the conductive layer patterns 22 of the alignment patterns 26 of FIG. 5. The metal gate patterns 120 are formed to have a pitch of a predetermined space S and a predetermined width W as shown in FIG. 1.

Continuously, a planarization interlayer insulating layer 130 may be formed to cover the buried interlayer insulating layer 160 together with the metal gate patterns 120 and the spacer patterns 52. Preferably, the planarization interlayer insulating layer 130 is formed of an insulating layer having the same etching ratio as that of the buried interlayer insulating layer 60. Contact holes 134 may be formed to pass through the planarization interlayer insulating layer 130 and the buried interlayer insulating layer 60. Preferably, the contact holes 134 are located between the metal gate patterns 120 to expose the semiconductor substrate 10. Landing pads 138 may be formed to fill the contact holes 134, respectively. Preferably, the landing pads 138 are formed of an N+ type polysilicon layer. As such, two transistors 140 and 150 including the metal gate patterns 120 are formed.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming a field effect transistor, comprising the steps of:
    forming a conductive gate electrode comprising silicon on a semiconductor substrate;
    depositing an insulating layer on the conductive gate electrode and on the sidewall spacers;
    planarizing the insulating layer for a sufficient duration to expose the conductive gate electrode;
    forming a first metal layer on the conductive gate electrode;
    thermally treating the first metal layer and the conductive gate electrode for a sufficient duration to convert a first portion of the conductive gate electrode into a first metal silicide region;
    removing first metal layer and the first metal silicide region to thereby expose a second portion of the conductive gate electrode;
    forming a second metal layer on the second portion of the conductive gate electrode; and
    thermally treating the second metal layer and the second portion of the conductive gate electrode for a sufficient duration to thereby convert the second portion of the conductive gate electrode into a second metal silicide region.

2. The method of claim 1, wherein said step of forming the first metal layer is preceded by the steps of:
    implanting source and drain region dopants into the semiconductor substrate, using the conductive gate electrode as a first implant mask;
    forming sidewall spacers on the conductive gate electrode; and
    implanting source and drain region dopants into the semiconductor substrate, using the conductive gate electrode and sidewall spacers as a second implant mask.

3. The method of claim 1, wherein the first metal layer comprises a material selected from a group consisting of nickel, cobalt, titanium, tantalum and tungsten.

4. The method of claim 1, wherein the second metal layer comprises a material selected from a group consisting of nickel, cobalt, titanium, tantalum and tungsten.

5. A method of forming an integrated circuit, comprising the steps of:
    forming first and second gate electrodes comprising silicon on a semiconductor substrate;
    forming sidewall spacers on the first and second gate electrodes;
    forming an insulating layer on and between the first and second gate electrodes;
    planarizing the insulating layer for a sufficient duration to expose upper surfaces of the first and second gate electrodes;
    forming a first metal layer on the exposed upper surfaces of the first and second gate electrodes;
    thermally treating the first metal layer and the first and second gate electrodes to thereby convert first portions of the first and second gate electrodes into first metal silicide regions;
    removing the first metal layer and the first metal silicide regions to expose second portions of the first and second gate electrodes;
    forming a second metal layer on the second portions of the first and second gate electrodes; and
    thermally treating the second metal layer and the second portions of the first and second gate electrodes to thereby convert second portions of the first and second gate electrodes into second metal silicide regions.

6. The method of claim 5, further comprising the step of planarizing the second metal layer for a sufficient duration to expose the planarized insulating layer.

7. The method of claim 6, further comprising the step of selectively etching the insulating layer to define a contact hole therein that exposes the semiconductor substrate.

8. The method of claim 5, wherein said step of forming an insulating layer is preceded by the step of implanting source and drain region dopants into the semiconductor substrate using the sidewall spacers as an implant mask.

9. The method of claim 5, wherein the first and second metal layers comprises a material selected from a group consisting of nickel, cobalt, titanium, tantalum and tungsten.

10. A method of forming a metal gate pattern in a semiconductor device, comprising:
    sequentially forming at feast one alignment pattern running across an active region of a semiconductor substrate and spacers respectively covering sidewalls of the alignment pattern, the alignment pattern being formed by an N+ type conductive layer pattern and an alignment capping layer pattern stacked thereon; forming a buried interlayer insulating layer on the semiconductor substrate to cover the alignment pattern and the spacers;
    performing a planarization process on the buried interlayer insulating layer, the alignment pattern and the spacers to expose the conductive layer pattern to form spacer patterns, the spacer patterns being interposed between the buried interlayer insulating layer and the conductive layer pattern;
    forming a disposable metal silicide layer on a portion of the conductive layer pattern using the spacer patterns and the buried interlayer insulating layer as a mask;
    removing the disposable metal silicide layer from the semiconductor substrate; subsequentially forming a metal silicide layer confined to the remaining portion of the conductive layer pattern using the spacer patterns and the buried interlayer insulating layer as a mask; and performing an etching process on the confined metal silicide layer using the spacer patterns and the buried interlayer insulating layer as an etching buffer layer to form a metal gate pattern filling between the spacer patterns.

11. The method according to claim 10, wherein upper surfaces of the metal gate patterns are formed on a plane different from upper surfaces of the spacer patterns.

12. The method according to claim 10, wherein upper surfaces of the metal gate patterns are formed on the same plane as upper surfaces of the spacer patterns.

13. The method according to claim 10, wherein the one portion and the remaining portion of the conductive layer pattern are formed to different thicknesses from each other between the spacer patterns, respectively.

14. The method according to claim 10, wherein the one portion and the remaining portion of the conductive layer pattern are formed to a same thickness between the spacer patterns.

15. The method according to claim 10, wherein forming the disposable metal silicide layer comprises:
  forming a disposable metal layer covering the conductive layer pattern, the spacer patterns and the buried interlayer insulating layer; and
  performing a thermal treatment process on the semiconductor substrate having the disposable metal layer, the thermal treatment process being performed to react the disposable metal layer with the portion of the conductive layer pattern.

16. The method according to claim 15, wherein the disposable metal layer is formed of one selected from a group consisting of nickel (Ni), cobalt (Co), titanium (Ti), tantalum (Ta) and tungsten (W).

17. The method according to claim 10, wherein forming the confined metal silicide layer comprises:
  forming a pattern metal layer covering the remaining portion of the conductive layer pattern, the spacer patterns and the buried interlayer insulating layer; and performing a thermal treatment process on the semiconductor substrate having the pattern metal layer, the thermal treatment process being performed to sufficiently react the remaining portion of the conductive layer pattern with the pattern metal layer.

18. The method according to claim 17, wherein the pattern metal layer is formed of one selected from a group consisting of Ni, Co, Ti, Ta and W.

19. The method according to claim 10, wherein the buried interlayer insulating layer is formed of an insulating layer having an etching ratio different from that of the spacers.

20. A method of forming a metal gate pattern in a semiconductor device, comprising:
  sequentially forming at least one alignment pattern running across an active region of a semiconductor substrate and spacers respectively covering sidewalls of the pattern, the alignment pattern being formed by using an N+ type conductive layer pattern and a sacrificial layer pattern;
  forming a buried interlayer insulating layer on the semiconductor substrate to cover the alignment pattern and the spacers;
  performing a planarization process on the buried interlayer insulating layer, the alignment pattern and the spacers to expose the sacrificial layer pattern to form spacer patterns, the spacer patterns being interposed between the buried interlayer insulating layer and the alignment pattern;
  removing the sacrificial layer pattern from the semiconductor substrate using the spacer patterns, the buried interlayer insulating layer and the conductive layer as a mask;
  forming a metal silicide layer confined to the conductive layer pattern using the spacer patterns and the buried interlayer insulating layer as a mask, by converting all of the conductive layer pattern to a metal silicide; and
  performing an etching process on the confined metal silicide layer using the spacer patterns and the buried interlayer insulating layer as an etching buffer layer to form a metal gate pattern filling between the spacer patterns.

21. The method according to claim 20, wherein upper surfaces of the metal gate patterns are formed on a plane different from upper surfaces of the spacer patterns.

22. The method according to claim 20, wherein upper surfaces of the metal gate patterns are formed on the same plane as upper surfaces of the spacer patterns.

23. The method according to claim 20, wherein the conductive layer pattern and the sacrificial layer patterns are formed to different thicknesses from each other between the spacer patterns.

24. The method according to claim 20, wherein the conductive layer pattern and the sacrificial layer patterns are formed to the same thickness between the spacer patterns.

25. The method according to claim 20, wherein forming the confined metal silicide layer comprises:
  forming a pattern metal layer covering the conductive layer pattern, the spacer patterns and the buried interlayer insulating layer; and
  performing a thermal treatment process on the semiconductor substrate having the pattern metal layer, the thermal treatment process being performed to sufficiently react the pattern metal layer with the conductive layer pattern.

26. The method according to claim 25, wherein the pattern metal layer is formed of one selected from a group consisting of nickel (Ni), cobalt (Co), titanium (Ti), tantalum (Ta) and tungsten (W).

27. The method according to claim 20, wherein the buried interlayer insulating layer is formed of an insulating layer having an etching ratio different from that of the spacers.

28. The method according to claim 20, wherein the buried interlayer insulating layer is formed of an insulating layer having an etching ratio different from that of the sacrificial layer pattern.

29. A method of forming a field effect transistor, comprising the steps of:
  forming a conductive gate electrode comprising silicon on a semiconductor substrate;
  forming electrically insulating spacers on sidewalls of the conductive gate electrode;
  depositing an insulating layer on the conductive gate electrode and on the electrically insulating spacers;
  planarizing the insulating layer for a sufficient to expose an upper surface of the conductive gate electrode;
  forming a first metal layer comprising a first metal on the exposed upper surface of the conductive gate electrode;
  annealing the first metal layer and the conductive gate electrode for a sufficient duration to convert a first portion of the conductive gate electrode into a first metal silicide region comprising the first metal;
  selectively etching the first metal layer and the first metal silicide region for a sufficient duration to expose a second portion of the conductive gate electrode having an upper surface that is recessed relative to an upper surface of the planarized insulating layer, using the electrically insulating spacers and the planarized insulating layer as an etching mask; and forming a second metal layer comprising a second metal on the recessed upper surface of the second portion of the conductive gate electrode.

30. The method of claim 29, further comprising the steps of:

annealing the second metal layer and the second portion of the conductive gate electrode for a sufficient duration to convert the second portion of the conductive gate electrode into a second metal silicide region comprising the second metal; and planarizing the second portion of the conductive gate electrode.

31. The method of claim 30, wherein said planarizing step comprises planarizing the second metal layer and the second portion of the conductive gate electrode for a sufficient duration to expose the upper surface of the planarized insulating layer.

* * * * *